United States Patent
Nagasaka et al.

(10) Patent No.: US 7,180,713 B2
(45) Date of Patent: Feb. 20, 2007

(54) MAGNETORESISTIVE ELEMENT

(75) Inventors: Keiichi Nagasaka, Kawasaki (JP);
Yoshihiko Seyama, Kawasaki (JP);
Takahiko Sugawara, Kawasaki (JP);
Yutaka Shimizu, Kawasaki (JP);
Atsushi Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 96 days.

(21) Appl. No.: 10/271,428

(22) Filed: Oct. 16, 2002

(65) Prior Publication Data
US 2003/0123200 A1 Jul. 3, 2003

(30) Foreign Application Priority Data
Dec. 27, 2001 (JP) .............................. 2001-396246

(51) Int. Cl.
*G11B 5/33* (2006.01)
(52) U.S. Cl. .................................................. 360/324.1
(58) Field of Classification Search ............. 360/324.1, 360/324.11, 324.2, 322; 428/692, 328
See application file for complete search history.

(56) References Cited

U.S. PATENT DOCUMENTS

| 5,652,054 | A | * | 7/1997 | Kikitsu et al. | 428/328 |
| 5,818,323 | A | | 10/1998 | Maeda et al. | 338/32 |
| 5,966,275 | A | * | 10/1999 | Iijima | 360/324.2 |
| 6,016,241 | A | | 1/2000 | Coffey et al. | 360/113 |
| 6,064,552 | A | | 5/2000 | Iwasaki et al. | 360/113 |
| 6,183,890 | B1 | * | 2/2001 | Fujita | 428/692 |
| 6,574,079 | B2 | * | 6/2003 | Sun et al. | 360/324.2 |
| 6,686,068 | B2 | * | 2/2004 | Carey et al. | 428/692 |
| 2004/0042127 | A1 | * | 3/2004 | Hoshiya et al. | 360/322 |
| 2004/0052008 | A1 | * | 3/2004 | Sugawara | 360/324.11 |

FOREIGN PATENT DOCUMENTS

| JP | 2000216454 | | 8/2000 |
| JP | 2001-143227 | | 5/2001 |
| JP | 2001143227 A | * | 5/2001 |

* cited by examiner

*Primary Examiner*—Tianjie Chen
(74) *Attorney, Agent, or Firm*—Greer, Burns & Crain, Ltd.

(57) ABSTRACT

A magnetoresistive element that detects a change of magnetoresistance by giving a sense current in the thickness direction of a magnetoresistive effect film including at least a base layer, a free layer, a non-magnetic layer, a pinned layer, a pinning layer, and a protection layer, includes a granular structure layer that includes conductive particles and an insulating matrix material in the form of a thin film containing the conductive particles in a dispersed state and having a smaller thickness than the particle diameter of the conductive particles, the granular structure layer being interposed between at least two adjacent layers among the base layer, the free layer, the non-magnetic layer, the pinned layer, the pinning layer, and the protection layer.

10 Claims, 9 Drawing Sheets

FIG.1 PRIOR ART

| Sample | RA ($\Omega \mu m^2$) |
|---|---|
| A | 2 |
| B | 0.36 |
| C | 2.14 |
| D | 0.23 |
| E | 0.24 |
| F | 0.29 |
| G | 0.36 |
| H | 2.44 |

MAGNETORESISTIVE ELEMENT

BACKGROUND OF THE INVENTION

1. Field of the Invention

The present invention generally relates to magnetoresistive elements for reproducing magnetic information recorded on magnetic recording media with high precision, and, more particularly, to a magnetoresistive element having a CPP (Current Perpendicular to Plane) structure that gives sense current in the thickness direction of the magnetoresistive element.

2. Description of the Related Art

The CPP-type magnetoresistive element having the sense current flowing in the film thickness direction characteristically increases the element output as the size of the element decreases. Such a CPP-type magnetoresistive element is expected to serve as a highly sensitive reproduction element for magnetic recording elements that have dramatically higher densities in recent years.

In a magnetoresistive element using a spin valve film or a tunnel junction film, the magnetizing direction of the free layer changes with a signal magnetic field transmitted from a magnetic recording medium. As the magnetizing direction of the free layer changes, the relative angle between the magnetizing direction of the free layer and the fixed magnetizing direction of the pinned layer also changes. The magnetoresistive element detects the relative angle as a change in magnetoresistive element.

In the CPP-type magnetoresistive element, the sense current is given in the film thickness direction by terminal electrodes arranged in contact with the upper and lower surface of the magnetoresistive effect film. A change of magnetoresistance is then detected so as to reproduce (or read) precisely a signal magnetic field transmitted from a magnetic recording medium. In the CPP-type magnetoresistive element, the smaller the area of the element in the direction perpendicular to the film thickness direction in which the sense current flows, the greater the change in resistance. In other words, the smaller the sense current flowing area (the section area), the greater the change in resistance. As the change in resistance becomes greater, the output of the element increases.

In a dry etching method using a conventional photolithography technique, however, one side of the above section area can be reduced to 100 nm at the smallest.

To break this limit on the minuteness, a magnetoresistive element in which a mixed layer made up of a metal and an insulating material covers the outside of the magnetoresistive effect film has been suggested. This mixture layer focuses the sense current to the metallic portion of the mixed layer. In this magnetoresistive element, the sense current path becomes smaller at the metal portion, and, therefore, the sense current path in the magnetoresistive effect film is made smaller than the section area of the physical element, so as to increase the output.

In the above structure, the sense current path running in the magnetoresistive effect film is uniformly reduced to increase the output of the element, but the resistance change ratio (MR ratio) of the element cannot be increased sufficiently. In other words, since the element resistance is also increased in this structure, the sense current value is restricted due to the heat generation from the element, and a further increase in output cannot be expected.

The inventors of the present invention have studied a technique for reducing the sense current flowing in the magnetoresistive effect film. To reduce the sense current, an oxide layer is inserted as a current path control layer in a part that contributes to a resistance change in a CPP-type magnetoresistive effect film, so that the sense current path can be reduced in size. By this method, the MR ratio can be increased with an increase of the element output.

The above oxide layer is formed by a sputtering method, or by forming a metal and then subjecting the metal to oxidization in a film forming chamber or in the air. Such an oxide layer is unevenly formed, and the area in which the oxide layer does not exist serves as the sense current path. In this method, the pores in the oxide layer and the unevenness of the film thickness are used to narrow the section area of the sense current path. However, it is difficult to correct the unevenness to form a desired sense current path. This difficulty will be described below, with reference to FIG. 1.

Figure 1:
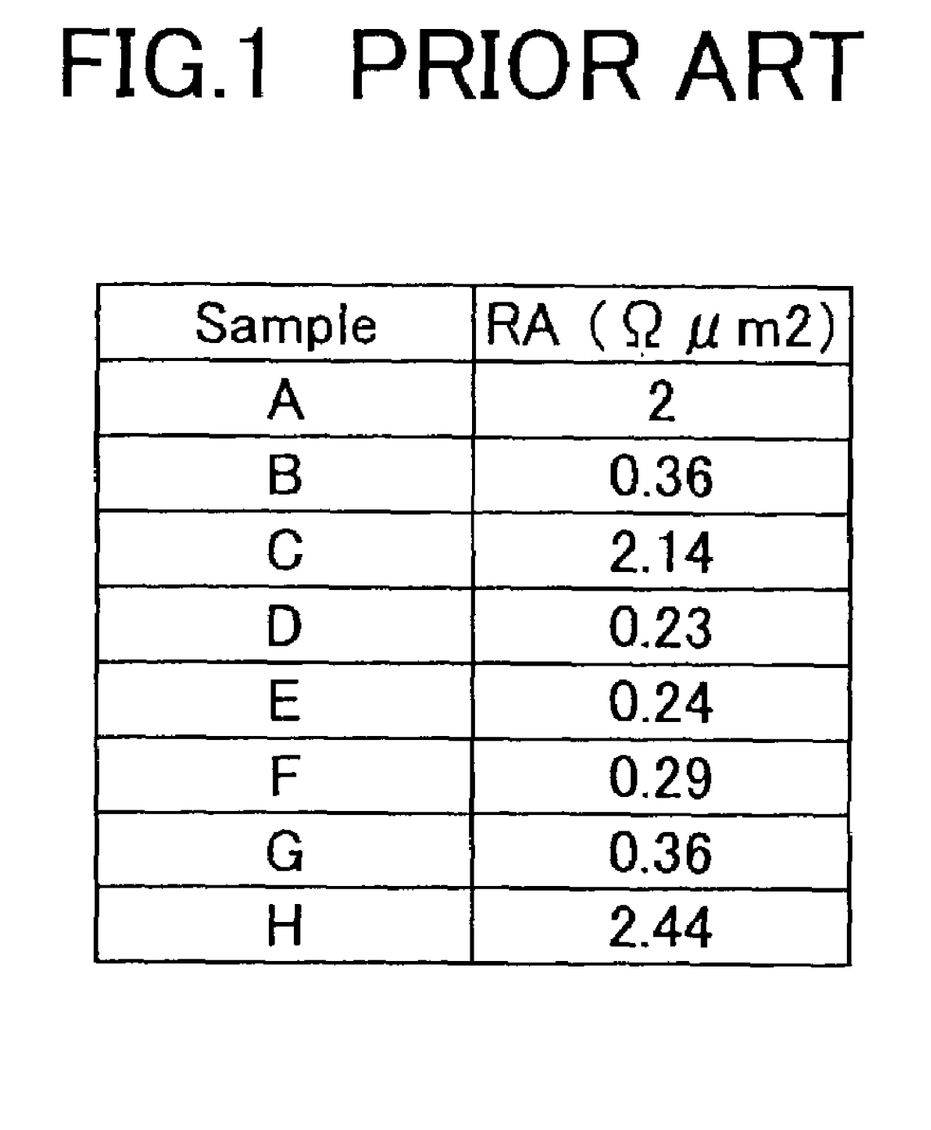
FIG. 1 collectively shows the resistance values of samples of oxide films formed on the free layer in a spin valve film in the prior art.

FIG. 1 collectively shows the resistance values of samples of oxide films formed on the free layer in a spin valve film. Each row in FIG. 1 shows the element resistance of each sample in a case where sense current flows in the film thickness direction of a CPP-type magnetoresistive element. In this magnetoresistive element, a Cu (2 nm)/Ta (1 nm) metal film is stacked on the free layer of a bottom-type spin valve film, and an oxide layer is then formed by an oxygen plasma method in a sputtering film forming chamber. The oxidization process is carried out under the conditions of 350 Pa×sec. The greatest element resistance is almost 10 times greater than the smallest element resistance, despite the fact that the oxidization processes for the samples have been carried out under the same conditions. This is because the oxide layer cannot be uniformly formed for each sample. If an oxide layer is employed as a narrowing layer for the sense current path, the unevenness of a ripped oxide layer (defective portions on the inner surface of the film, pores, or oxide film thickness) should be used. These results show that correcting the unevenness of actually formed oxide layers is very difficult. Therefore, it has become apparent that further studies are necessary to secure the stability of the element properties and the reliability of products to which the above technique is applied.

SUMMARY OF THE INVENTION

Accordingly, it is a general object of the present invention to provide a novel and useful magnetoresistive element in which the above disadvantages are eliminated.

A more specific object of the present invention is to provide a CPP-type magnetoresistive element that can surely increase the element output while restricting an unnecessary increase of resistance, and is compatible with high-density magnetic recording media.

The above objects of the present invention are achieved by a magnetoresistive element that detects a change of magnetoresistance by giving a sense current in the thickness direction of a magnetoresistive effect film including at least a base layer, a free layer, a non-magnetic layer, a pinned layer, a pinning layer, and a protection layer. This magnetoresistive element includes: the magnetoresistive effect film; and a granular structure layer that includes conductive particles and an insulating matrix material in the form of a thin film containing the conductive particles in a dispersed state and having a smaller thickness than the particle diameter of the conductive particles. This granular structure layer is interposed between at least two adjacent layers among the base layer, the free layer, the non-magnetic layer, the pinned layer, the pinning layer, and the protection layer.

Since the granular structure layer containing the conductive particles as a current path control layer for narrowing the sense current is inserted between adjacent layers in the above magnetoresistive element, the element output can be effectively increased.

The granular structure layer may be interposed between the pinned layer and the pinning layer, and the conductive particles may be made of a magnetic metal material, because it is possible to maintain exchange coupling between the pinned layer and the pinning layer and reduce the diameter of the sense current path so that the element output can be increase surely.

The above objects of the present invention are also achieved by a magnetoresistive element that detects a change of magnetoresistance by giving a sense current in the thickness direction of a magnetoresistive effect film including at least a base layer, a free layer, a non-magnetic layer, a pinned layer, and a protection layer. This magnetoresistive element includes: the magnetoresistive effect film; and a granular structure layer that includes conductive particles and an insulating matrix material in the form of a thin film containing the conductive particles in a dispersed state and having a smaller thickness than the particle diameter of the conductive particles. This granular structure layer is interposed between divided layers that are formed by dividing at least one of the free layer, the non-magnetic layer, and the pinned layer.

Since the granular structure layer as a current path control layer for narrowing sense current is inserted between the divided layers in the magnetoresistive element, the element output can be effectively increased.

The granular structure layer may be inserted in at least one of the free layer, and the pinned layer, and the conductive particles may be made of a magnetic metal material. The granular structure layer may be inserted in the non-magnetic layer, and the conductive particles may be made of a non-magnetic metal material, because it is possible to maintain original functions of respective layers forming the magnetoresistive element and reduce the diameter of the sense current path so that the element output can be increase surely.

The above objects of the present invention are also achieved by a magnetoresistive element that detects a change of magnetoresistance by giving a sense current in the thickness direction of a magnetoresistive effect film including at least a base layer, a free layer, a non-magnetic layer, a pinned layer, a pinning layer, and a protection layer. This magnetoresistive element includes a granular structure layer that includes conductive particles and an insulating matrix material in the form of a thin film containing the conductive particles in a dispersed state and having a smaller thickness than the particle diameter of the conductive particles. This granular structure layer is at least one of the free layer, the non-magnetic layer, the pinned layer, and the pinning layer.

Since at least one of the layers constituting the magnetoresistive effect film is formed as the granular structure layer having the function of controlling sense current, the element output can be increased with the same layer structure as in the prior art.

The granular structure layer may constitute the free layer, the pinned layer, and the pinning layer, and the conductive particles in the granular structure layer may be made of a magnetic metal material. The granular structure layer may constitute the non-magnetic layer, and the conductive particles in the granular structure layer may be made of a non-magnetic metal material, because it is possible to maintain original functions of respective layers forming the magnetoresistive element and reduce the diameter of the sense current path so that the element output can be increase surely.

The above magnetoresistive element may further include a film selected from the group consisting of a forward-direction stacked (top-type) spin valve film, a backward-direction stacked (bottom-type) spin valve film, a dual-type spin valve film, a ferri-pin-type spin valve film, a ferri-pin dual-type spin valve film, and a tunnel junction film, the film being inserted in the magnetoresistive effect film.

The above objects of the present invention are also achieved by a magnetic recording device that includes one of the above magnetoresistive elements of the present invention as a magnetic head for magnetic reproduction.

With this structure, a magnetic recording device that can reproduce magnetic information with high precision, with a high-density magnetic recording medium mounted on the magnetic recording device. Also, the magnetoresistive element used as a magnetic head can increase the recording density of the magnetic recording device.

Other objects, features, and advantages of the present invention will become more apparent from the following detailed description when read in conjunction with the accompanying drawings.

DESCRIPTION OF THE PREFERRED EMBODIMENTS

The following is a description of embodiments of the present invention, with reference to the accompanying drawings.

The inventors of the present invention have made further studies on current path control layers that narrow sense current and contribute to resistance changes in CPP-type magnetoresistive effect films.

Figure 2:
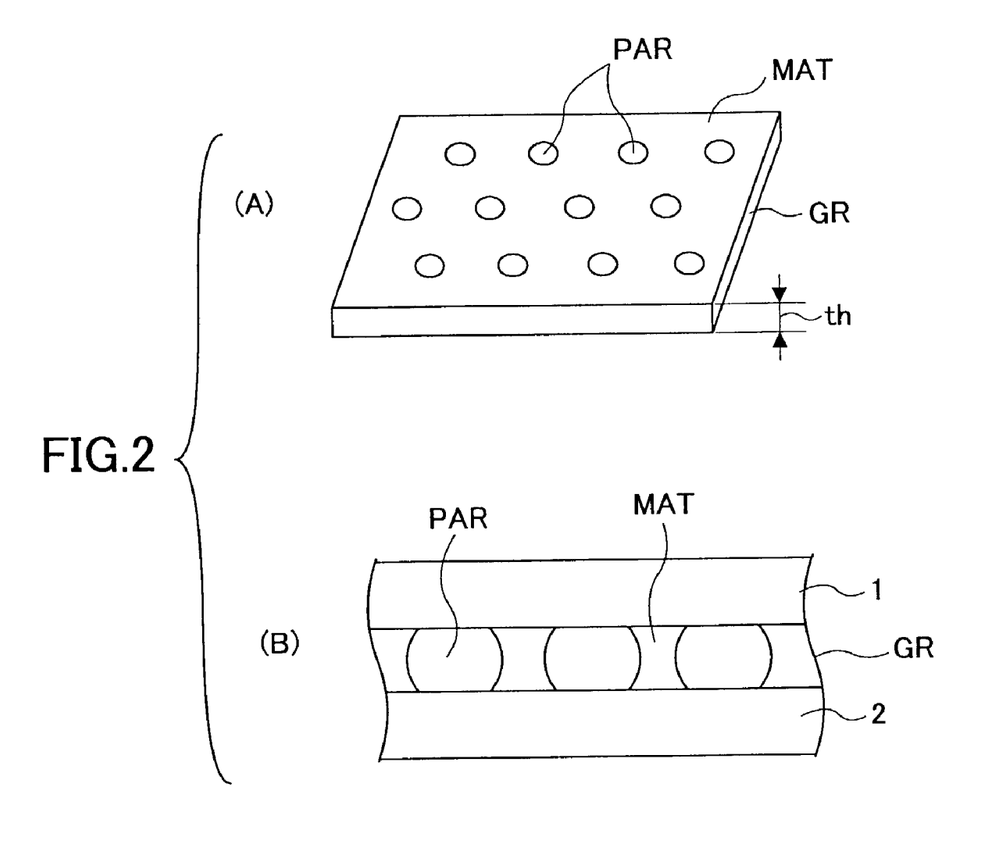
FIG. 2 schematically shows a granular structure layer inserted in a magnetoresistive element in accordance with the present invention.

A CPP-type magnetoresistive element of the present invention has a basic structure having a granular structure layer inserted as an electric current path control layer in a magnetoresistive effect film. FIG. 2 schematically shows such a granular structure layer GR. FIG. 2-(A) is a schematic view of the entire structure of the granular structure layer GR, and FIG. 2-(B) is an enlarged partial view of the granular structure layer GR interposed between an upper layer 1 and a lower layer 2. As shown in FIG. 2-(A), the granular structure layer GR contains conductive particles PAR in a dispersed state in an insulating matrix material MAT. The film thickness th of the insulating matrix material MAT, namely, the film thickness of the granular structure layer, is characteristically smaller than the particle diameter of the conductive particles PAR. The conductive particles are exposed through the surface of the granular structure layer GR, so that the conductive particles are constantly in contact with the upper layer 1 and the lower layer 2. In such a structure, sense current can certainly flow in the film thickness direction. Accordingly, desired sense current paths can be designed by adjusting the state of the conductive particles whenever necessary. The structure of the granular structure layer GR will be described later in greater detail.

Figure 3:
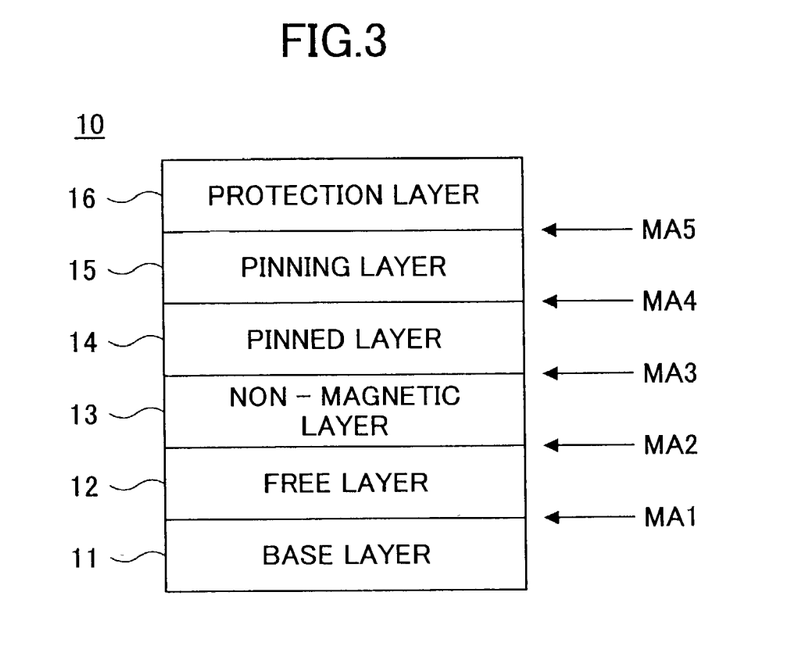
FIG. 3 shows a structure in which a granular structure layer is inserted in the interlayer spacing of a magnetoresistive effect film formed by a spin valve film having layers stacked in the forward direction (top-type layers)
Figure 4:
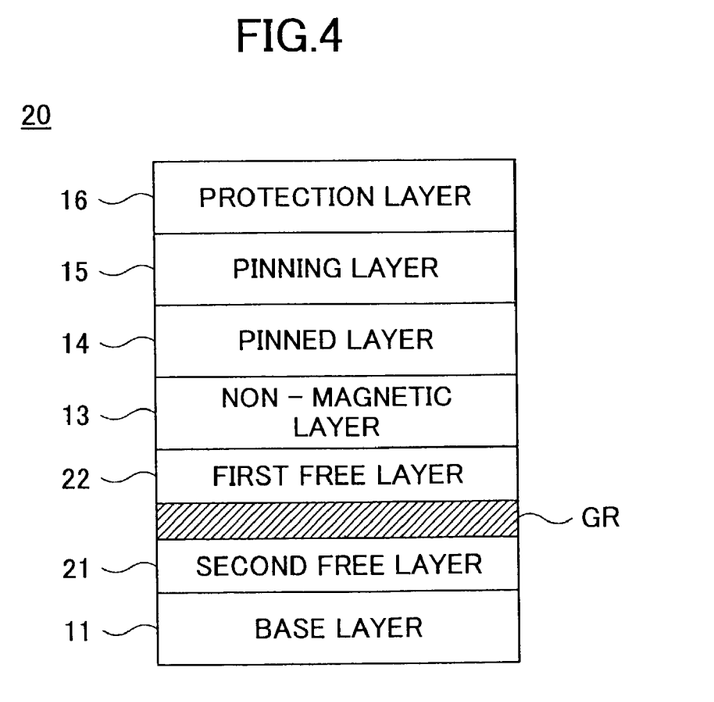
FIG. 4 shows a structure in which the free layer of a magnetoresistive effect film formed by a spin valve film having layers stacked in the forward direction (top-type layers) is divided into two layers, and a granular structure layer is interposed between the two divided layers.
Figure 5:
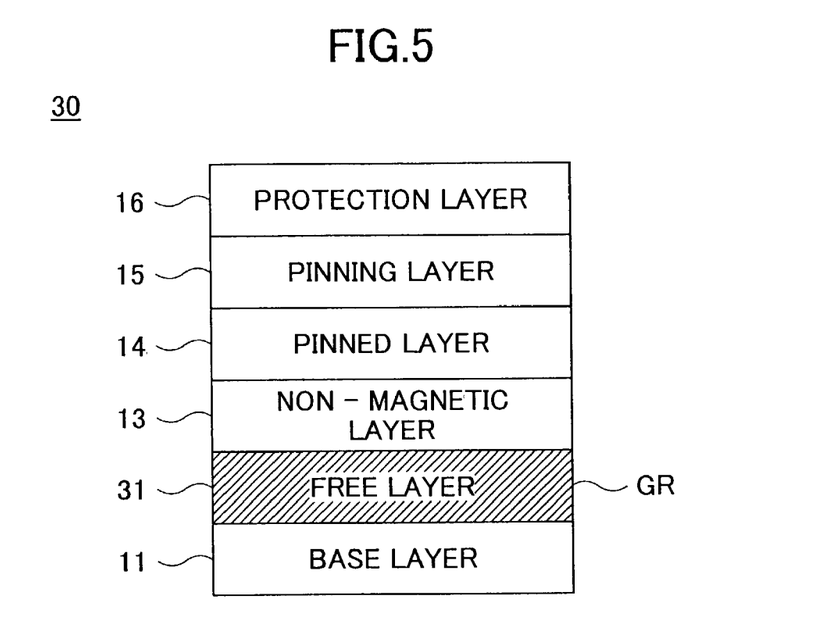
FIG. 5 shows a structure in which the free layer of a magnetoresistive effect film formed by a spin valve film having layers stacked in the forward direction (top-type layers) serves as a granular structure layer.

The magnetoresistive effect film of this embodiment may have a structure in which a granular structure layer is interposed between two of the layers or inserted in a certain layer that have been divided into two. Alternatively, the magnetoresistive effect film of this embodiment may have a structure in which a particular layer serves as a granular structure layer. Referring now to FIGS. 3 through 5, a structure in which so-called spin valve films are employed as a magnetoresistive effect film will be described.

FIG. 3 shows a structure in which a granular structure layer inserted in a magnetoresistive effect film 10 that is made up of spin valve films stacked in the forward direction (top-type spin valve films). The magnetoresistive effect film 10 includes a base layer 11, a free layer 12, a non-magnetic layer 13, a pinned layer 14, a pinning layer 15, and a protection layer 16, which are stacked on a substrate (not shown) in this order.

The magnetoresistive effect film 10 of this embodiment may have at least one granular structure layer GR inserted in the interlayer spacings MA1 through MA5 of the above layers 11 though 16. To reduce the diameter of the path for sense current surely, it is preferable to insert two or more granular structure layers GR in different interlayer spacings. In a structure in which the diameter of the sense current path is surely reduced at a magnetoresistance change detecting place, the granular structure layers GR are inserted in the interlayer spacing MA1 between the base layer 11 and the free layer 12, and in the interlayer spacing MA4 between the pinned layer 14 and the pinning layer 15.

The granular structure layer GR inserted in the interlayer spacing MA1 contains conductive metal particles, and is preferably made of an insulating matrix material MAT so as to increase the cristallinity and orientation of the free layer 12 at the time of film formation. The granular structure layer GR may have conductive and magnetic metal particles dispersed therein so as to function integrally with the free layer 12 after the film formation.

The granular structure layer GR inserted in the interlayer spacing MA4 needs to maintain antiferromagnetic bonding between the pinned layer 14 and the pinning layer 15. To do so, the metal particles should preferably be made of a magnetic material. Such a conductive and magnetic granular structure layer GR may function integrally with the pinned layer 14 or the pinning layer 15.

A granular structure layer GR may also be inserted in the interlayer spacing MA2 between the free layer 12 and the non-magnetic layer 13, or in the interlayer spacing MA3 between the pinned layer 14 and the non-magnetic layer 13. The granular structure layer GR inserted in the interlayer spacing MA2 may contain magnetic metal particles that function integrally with the free layer 12, or may contain non-magnetic metal particles that function integrally with the non-magnetic layer 13. The same goes for the granular structure layer GR inserted in the interlayer spacing MA3. In other words, the relationship between each granular structure layer GR and the adjacent layer prior to the layer insertion is maintained in the structure shown in FIG. 3.

The magnetoresistive effect film 10 shown in FIG. 3 is produced in the same manner as in the conventional art using the lithography technique. A magnetoresistive effect film described below is also produced in the same manner. Although the spin valve film shown in FIG. 3 has the layers stacked in the forward direction (top-type layers), this embodiment can also be applied to a spin valve film having the layers stacked in the backward direction (bottom-type layers), with the free layer 11 being placed at the top.

FIG. 4 shows a structure in which the free layer of a magnetoresistive effect film 20 formed by a spin valve film having the layers in the forward direction (top-type layers) is divided into two layers, and a granular structure layer is inserted between the divided layers. It should be noted that the same components as in FIG. 3 are denoted by the same reference numerals, and explanation for those components will be omitted.

The free layer of the magnetoresistive effect film 20 is divided into a first free layer 22 and a second free layer 21, and a granular structure layer GR is inserted between the first free layer 22 and the second free layer 21. With this granular structure layer between the free layers, a current path control layer that can effectively reduce the diameter of the sense current path. To reduce the diameter of the sense current path surely, the pinned layer 14 may also be divided into two layers, with a granular structure layer GR being inserted between the two layers.

When the free layer and the pinned layer are both divided into two layers with a granular structure layer GR inserted between each two divided layers as described above, a conductive or magnetic material should be employed as the metal particles, as in the embodiment shown in FIG. 3, so that the divided upper and lower layers can maintain the original functions. Also, the non-magnetic layer 15 may be divided into two layers, with a granular structure layer GR being inserted into the two layers. In such a case, it is preferable to employ a non-magnetic material as the metal particles, instead of a magnetic material.

Although a spin valve film having layers stacked in the forward direction (top-type layers) is shown in FIG. 4, this embodiment may be applied to a spin valve film having the layers stacked in the backward direction (bottom-type layers), with the free layer 11 being placed at the top.

FIG. 5 shows a structure in which the free layer of a magnetoresistive effect film 30 formed by a spin valve film having layers stacked in the forward direction (top-type layers) serves as a granular structure layer. In the structures shown in FIGS. 3 and 4, the granular structure layers GR are added between the layers. In the structure shown in FIG. 5, on the other hand, the free layer 31 serves as a granular structure layer GR. Accordingly, the granular free layer 31 functions as a free layer and a current path control layer. If the pinned layer 14 also serves as a granular structure layer GR, two current path control layers can be formed in the same layer structure as the prior art. Thus, a magnetoresistive effect film that can surely reduce the diameter of the sense current path can be obtained.

The non-magnetic layer 13 may also serve as a granular structure layer GR. In the example shown in FIG. 5, if a magnetic layer serves as a granular layer GR, magnetic metal particles are employed so as to obtain the original functions of the magnetic layer. If a non-magnetic layer serves as a granular structure layer GR, non-magnetic metal particles are employed so as to obtain the original functions of the non-magnetic layer.

Although a spin valve film having the layers stacked in the forward direction (top-type layers) is shown as the magnetoresistive effect film 30 in FIG. 5, this embodiment can also be applied to a spin valve film having the layers stacked in the backward direction (bottom-type layers), with the free layer 11 being placed at the top.

The embodiments shown in FIGS. 3 through 5 may be combined. For instance, a granular structure layer may be inserted between two divided free layers, with another granular structure layer being inserted between the pinning layer and the pinned layer.

Figure 6:
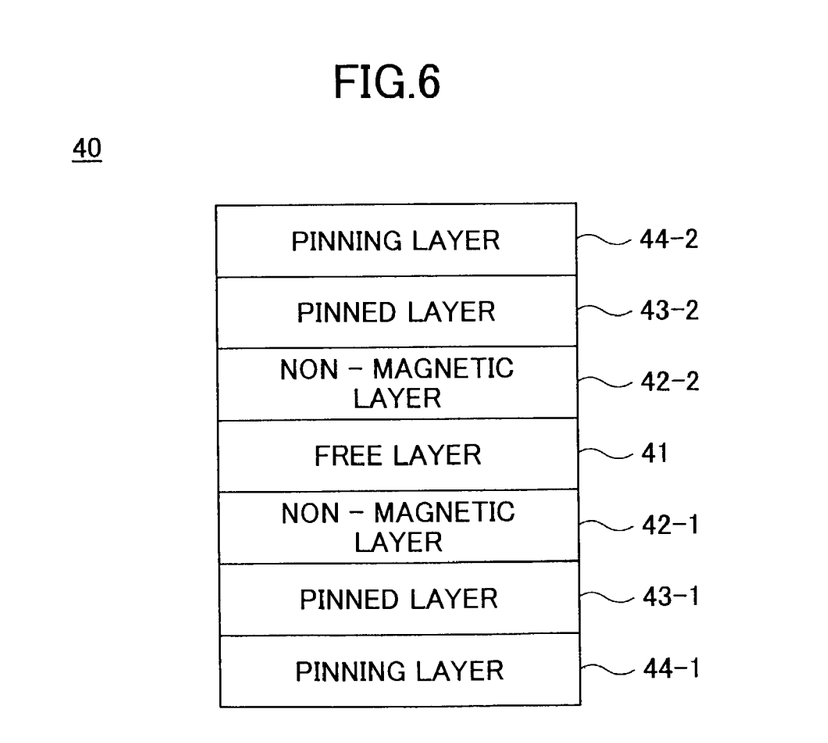
FIG. 6 shows an example of a dual-type spin valve film in accordance with the present invention.
Figure 7:
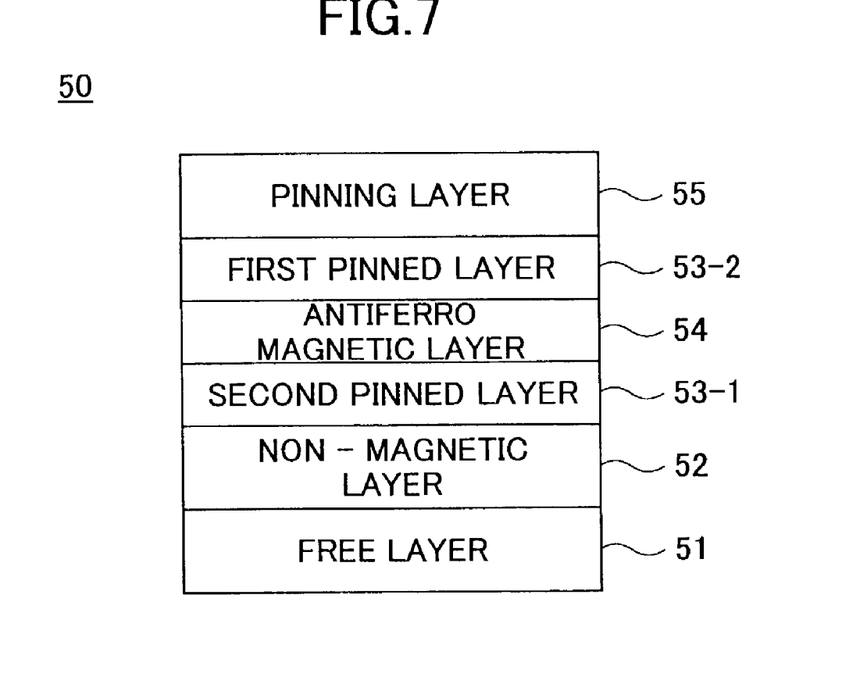
FIG. 7 shows an example of a ferri-pin type spin valve film in accordance with the present invention.
Figure 8:
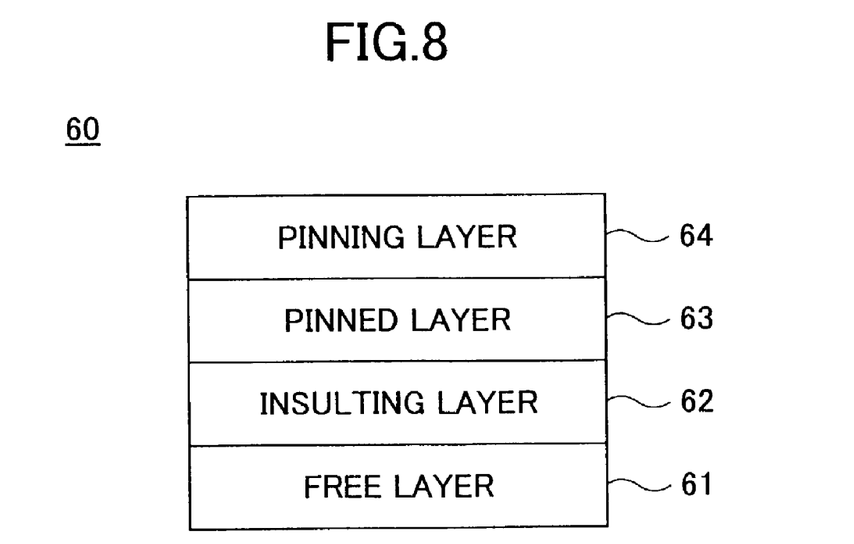
FIG. 8 shows an example of a tunnel junction film in accordance with the present invention.

FIGS. 6 through 8 show other examples of limited structures that can be employed as magnetoresistive effect films in accordance with the present invention.

FIG. 6 shows a dual-type spin valve film having non-magnetic layers 42-1 and 42-2, pinned layers 43-1 and 43-2, and pinning layers 44-1 and 44-2, which are stacked symmetrically in the vertical direction, with a free layer 41 being located at the center. Any of the embodiments shown in FIGS. 3 through 5 may also be applied to such a dual-type spin valve film.

FIG. 7 shows a so-called ferri-pin-type spin valve film having a ferri-pin structure that includes a free layer 51, a non-magnetic layer 52, and a pinning layer 55, with a first pinned layer 53-2 and a second pinned layer 53-1 being joined to each other by a antiferro coupling layer 54. Any of the embodiments shown in FIGS. 3 through 5 can also be applied to such a spin valve film having the ferri-pin FIG. 8 shows a so-called tunnel junction film that includes a free layer 61, an insulating layer 62, a pinned layer 63, and a pinning layer 64. Any of the embodiments shown in FIGS. 3 through 5 can also be applied to such a tunnel junction film.

In the following, the above granular structure layer will be described in greater detail. The granular structure layer contains non-solid materials of different types, and has a conductive metal material in the form of minute particles dispersed in another insulating matrix material.

The insulating matrix material may be an oxide, such as SiO, MgO, or AlO. In this granular structure layer, a conductive metal pillar is formed in an insulating member, and this pillar serves as a sense current path. The diameters of the metal fine particles can be adjusted by selecting suitable materials, a suitable film formation method, and a heat processing method. Examples of conductive metal fine particles that can be employed in this embodiment include Cu, Ag, and Au. Further examples of metal fine particles that are also magnetic include Co, Ni, and Fe.

As disclosed in J. Appl. Phys., 82(11) 5646(1997), written by M. Ohnuma, K. Hono, E. Abe, H. Onodera, S. Mitani, and H. Fujimori, the diameters of the metal pillar can be made as small as a few nanometers by employing a Co—Al—O material. With a dry etching method using a conventional photolithography technique, the size of a sense current path can be made 100 nanometers at the smallest. To the contrary, by employing the granular structure layer as a current path control layer, the section area of the sense current path can be reduced to approximately 1/400 of the conventional size.

Figure 9:
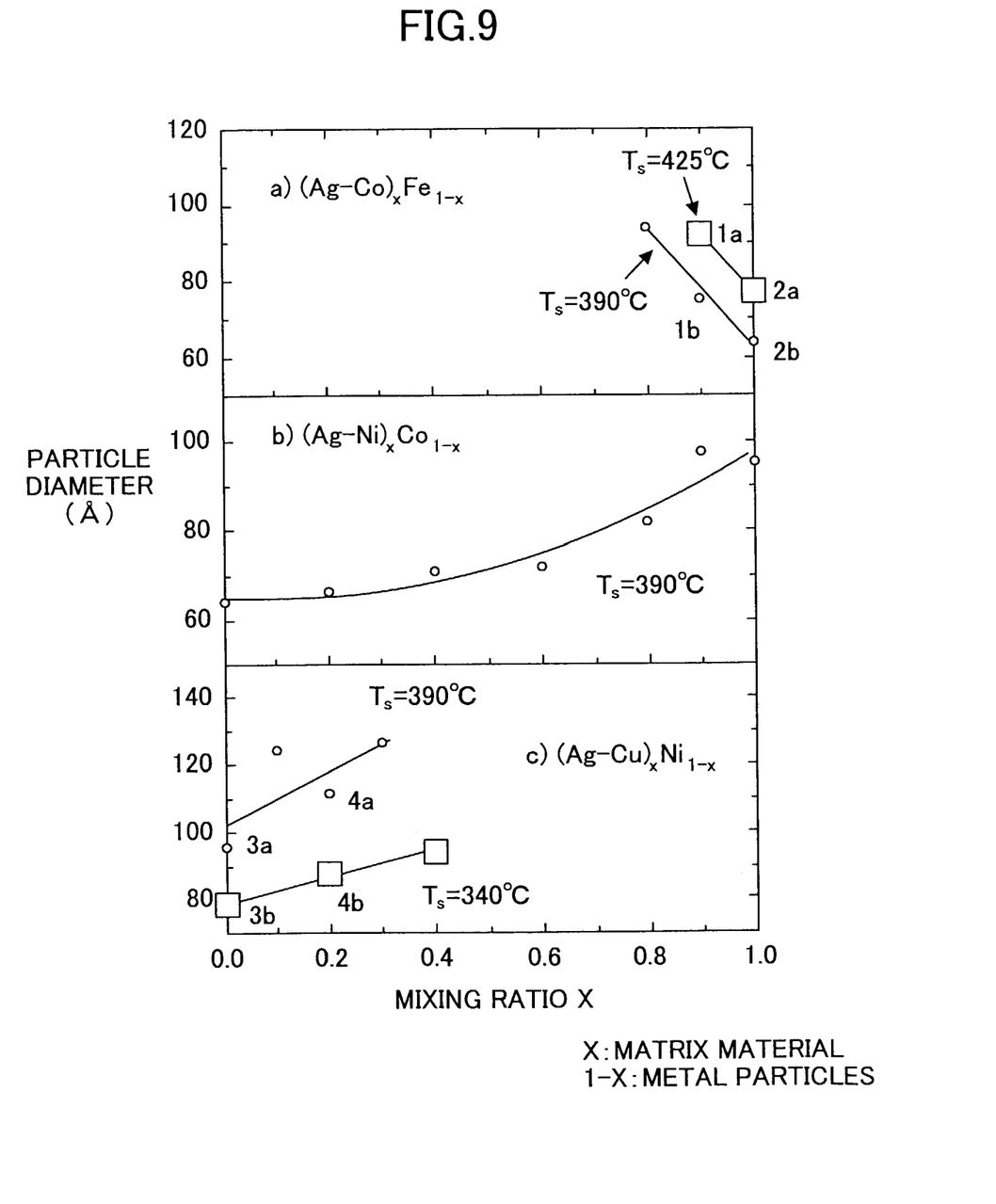
FIG. 9 shows the relationship between the metal particle diameter, the film composition, and the heat processing temperature in a granular structure film and a film having a similar structure.

J. Appl. Phys., 77(6) 2508(1995), written by D. J. Kubinski and H. Holloway, discloses the relationship between the metal fine particle diameter, the film composition, and the heat processing temperature in a structure film having a similar structure to the granular structure film of this embodiment. FIG. 9 shows this relationship. In a structure similar to the granular structure layer having an Ag material as a matrix material, the metal fine particle diameter systematically changes with the composition rate or the heat processing temperature of the metal fine particle material (Fe, Co, or Ni). From the results shown in FIG. 9, it is apparent that the metal particle diameter can be adjusted by selecting a suitable formation method for the granular structure layer formed by different materials, and it can be confirmed that the controllability for the sense current path is higher than the controllability with the above method using an oxide layer.

In the following, another preferred embodiment of the present invention will be described. In this embodiment, granular structure layers are inserted as current path control layers between the free layer and the base layer and between two divided pinned layers in a magnetoresistive effect film. As a comparative example with this embodiment, a conventional case where current path control layers are formed outside a magnetoresistive effect film will also be described in the following.

Figure 10:
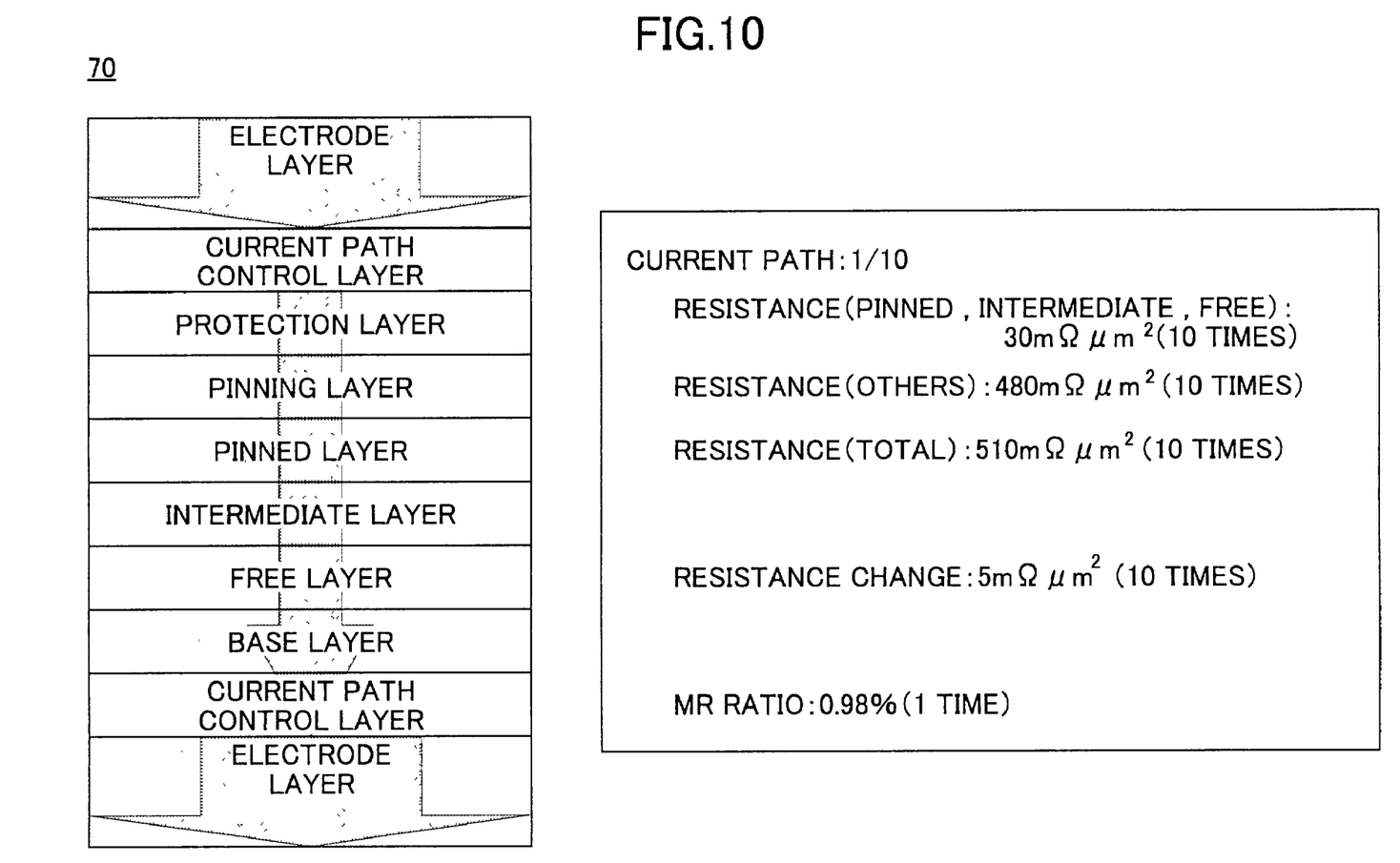
FIG. 10 shows an example of the relationship between the conventional element structure having a current path control layer covering the outside of a magnetoresistive effect film and the element properties.
Figure 11:
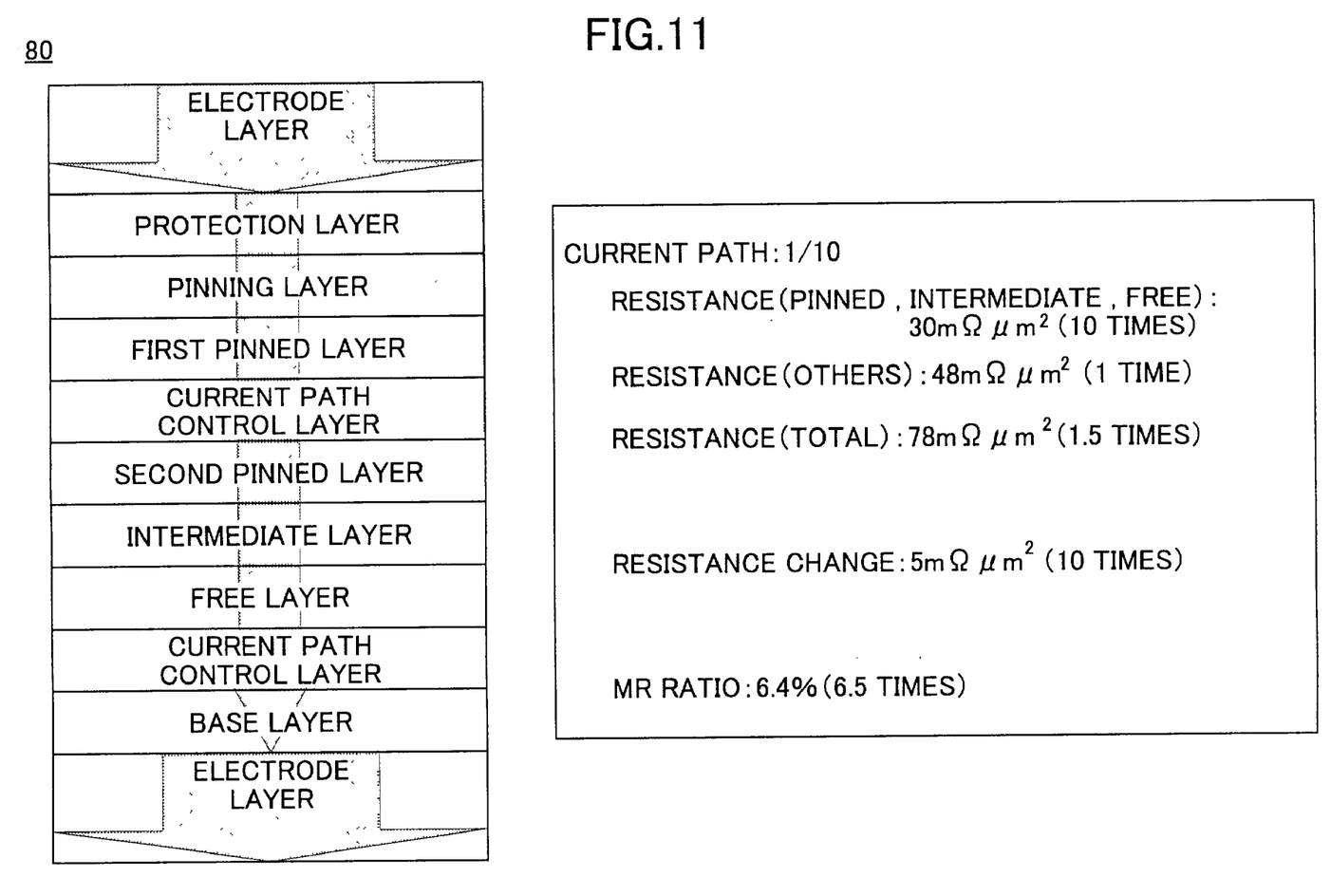
FIG. 11 shows an example of the relationship between a element structure and element properties of a structure in which granular structure layers as current path control layers are inserted between the free layer and the base layer, and between the two divided pinned layers, in a magnetoresistive resistive film.

FIG. 10 shows an example of the relationship between a conventional element structure 70 having current path control layers outside a magnetoresistive effect film and the element properties. FIG. 11 shows an example of the relationship between a element structure 80 and the element properties of a structure in which granular structure layers are inserted as current path control layers between the free layer and the base layer and between two divided pinned layers in a magnetoresistive effect film of this embodiment.

FIGS. 10 and 11 show comparisons of the locations of the current path control layers in a magnetoresistive effect film, the resistance (R) of the element with the reduction of the sense current path diameter, the resistance change (ΔR), and the resistance change ratio (MR ratio). In FIGS. 10 and 11, the layer structure of each element is shown on the left side, and the resistance (R), the resistance change (ΔR), and the resistance change ratio (MR ratio) are collectively shown on the right side.

The magnetoresistive effect films in the examples shown in FIGS. 10 and 11 are standard spin valve films each having a structure as follows. A Ta (in-plane specific resistance: 180 μΩcm) film having a thickness of 5 nm is employed as the base layer (a buffer layer) and the protection layer (a gap layer). A PdPtMn (specific resistance: 200 μΩcm) film having a thickness of 15 nm is employed as the pinning layer. A CoFeB film having a thickness of 2 nm is employed as the pinned layer. A Cu film having a thickness of 3 nm is employed as a nonmagnetic layer. A NiFe film having a thickness of 2 nm or a CoFeB film having a thickness of 2.5 nm is employed as the free layer. The specific resistance with a resistance change in the free layer, the nonmagnetic layer, and the pinned layer is calculated by subtracting the specific resistance of the base layer, the protection layer, and the pinning layer, from the specific resistance (60 µΩcm) of the entire film measured in a CIP mode. The calculation result is approximately 30 µΩcm.

Assuming that the above specific resistance stands in the film thickness direction, the resistance of a section area of 1 µm$^2$ is calculated. The result is approximately 51 mΩµm$^2$. The resistance change of a CPP structure element formed by a spin valve film having this film structure is 0.5 mΩµm$^2$. Here, the resistance, the resistance change, and the resistance change ratio of the element having the arrangements of the current path control layers shown in FIGS. 10 and 11 are calculated. With the current path control layers, the diameter of the sense current path of the element is assumingly reduced to 1/10.

In the conventional structure in which the current path control layers are formed outside the magnetoresistive effect film shown in FIG. 10, the resistance change in the magnetoresistive effect film becomes 10 times greater, and therefore the output is increased. However, the resistance also becomes 10 times greater. Accordingly, the resistance change ratio (MR ratio) is 1, which remains unchanged.

Meanwhile, in the structure of this embodiment in which the current path control layers are inserted in the magnetoresistive effect film as shown in FIG. 11, the current path control layers are placed in the vicinity of the pinned layers, the non-magnetic layer, and the free layer, which contribute to the actual magnetoresistive effect. Here, the resistance change increases in the same manner as in the conventional example shown in FIG. 10. The resistance increases only at the pinned layer, the non-magnetic layer, and the free layer, which have relatively small resistance. On the other hand, the resistance does not increase at the base layer, the pinning layer, and the protection layer.

This result shows that the resistance of the entire film becomes approximately 1.5 times greater than the resistance in a case where the sense current path is not reduced in diameter. Accordingly, the resistance change ratio (MR ratio) of the magnetoresistive effect film having this structure increases and becomes approximately 6.6 times greater than that in the conventional structure. Also, the diameters of the metal fine particles of the granular structure layer to be inserted are proportionally controlled so as to increase the element output. The sense current path at a part that contributes to the actual film resistance change is reduced so as to increase the resistance change and the resistance change ratio of the film.

The element output partially depends on the sense current value. However, with the property deterioration due to the heat generation of the element, the sense current value should be determined by the resistance. From this point of view, a further increase of the output can be expected from the magnetoresistive element of this embodiment having a smaller increase of the film resistance, compared with the conventional structure.

Although the standard single-type spin valve film is employed in the above element structure used for comparison, the same effects can be expected from a structure including a ferri-type pinned layer described above or a dual-type spin valve film. In such a case, it is effective to insert current path control layers in the upper and lower pinned layers. Also, similar effects, though slightly reduced, can be obtained in a case where current path control layers are inserted in the non-magnetic layer or a free layer.

In the above-described structure, two current path control layers are inserted. However, in a case where only one current path control layer is employed, the diameter of the sense current path is reduced in the vicinity of the current path control layer, and sufficient effects for increasing the element output can be obtained, although slightly reduced compared with the case where two current path control layers are employed. In this case, the current path control layer should also be inserted in the pinned layer, the non-magnetic layer, or the free layer, which contribute to a magnetoresistive change. Alternatively, the current path control layer should be inserted in the vicinity of those layers.

If the current path control layer is inserted between divided pinned layers, it is necessary to prevent a decrease in the pinning force for securing the magnetization of the pinned layers, i.e., a so-called unidirectional anisotropic magnetic field Hua. To do so, the granular material and the film thickness should be optimized in line with the unidirectional anisotropic magnetic field Hua.

In a case where the free layer is divided into two free layers and the current path control layer is inserted between the two free layers, it is also necessary to prevent deterioration of the properties of the free layers. If the current path control layer inserted between the free layers adversely affects the properties of the free layers, a bond shielding layer having a relatively high resistance should be inserted between the current path control layer and each free layer, so that the adverse influence on the free layers can be eliminated.

As for a case where the non-magnetic layer is divided into two layers and the current path control layer is inserted between the two layers, there is no problem with the CPP structure element that has characteristically no shunt effects for current, unlike a CIP structure film.

Figure 12:
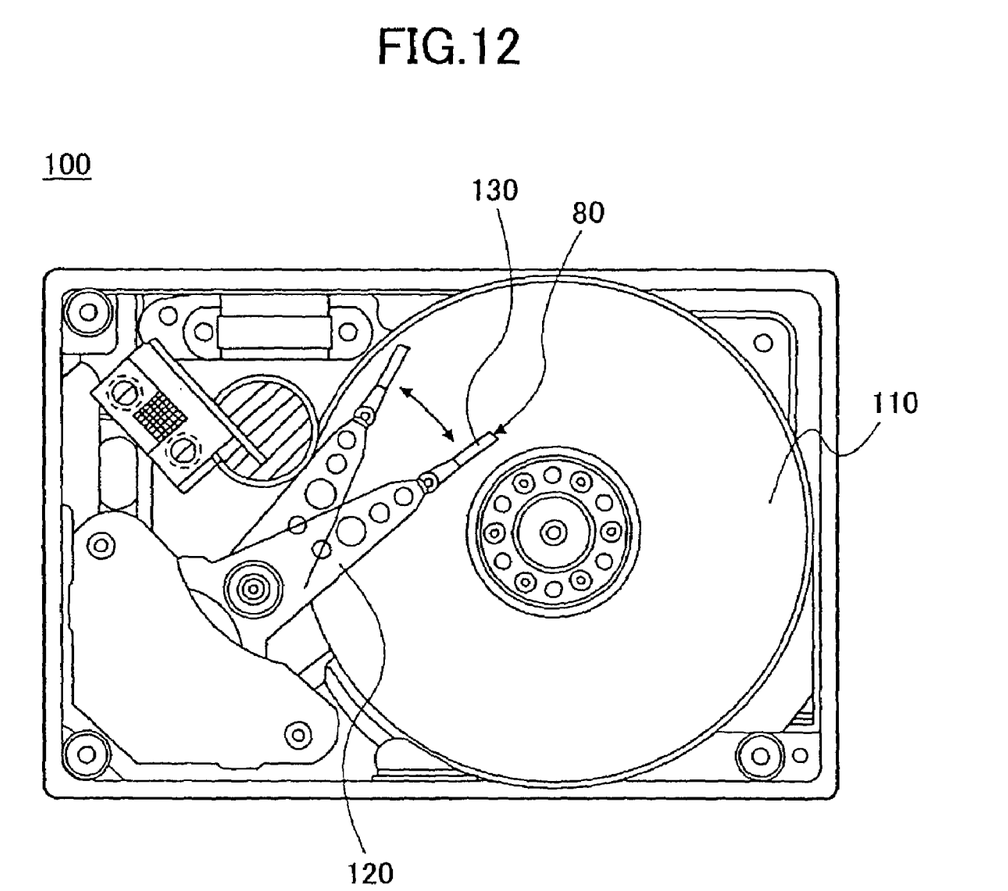
FIG. 12 shows the principal parts of a magnetic recording device in accordance with the present invention.

The structures of CPP-type magnetoresistive elements have been described in detail. Any of these CPP-type magnetoresistive elements can be employed as a magnetic head in a magnetic recording device, and can reproduce magnetic information recorded on a magnetic recording medium with high precision. Hereinafter, a magnetic recording device that has one of the magnetoresistive elements of the above embodiments as a magnetic head will be briefly described. FIG. 12 shows the principal parts of the magnetic recording device. A hard disk 110 as a magnetic recording medium is rotatably mounted on the magnetic recording device 100. With a predetermined amount of floatation above the surface of the hard disk 110, the CPP-type magnetoresistive element 80 shown in FIG. 11, for instance, is employed as a magnetic head for performing a magnetic reproducing operation. The magnetic head 80 is fixed to the front end of a slider 130 located at the top end of an arm 120. A two-step actuator that is the combination of a regular actuator and an electromagnetic micromotion actuator can be employed for positioning the magnetic head 80.

Although the magnetic head 80 is employed for reproduction in this example, it should be apparent that the magnetic head 80 used in combination with an interactive thin-film head can function as a recording and reproducing head.

The present invention is not limited to these embodiments, but variations and modifications may be made without departing from the scope of the present invention.

This patent application is based on Japanese priority patent application No. 2001-359310 filed on Dec. 27, 2001, the entire contents of which are hereby incorporated by reference.

What is claimed is:

1. A magnetoresistive element that detects a change of magnetoresistance by giving a sense current in the thickness direction of a magnetoresistive effect film including at least a base layer, a free layer, a non-magnetic layer, a pinned layer, a pinning layer, and a protection layer,
   the magnetoresistive element comprising a granular structure layer that includes conductive particles and an insulating matrix material in the form of a thin film containing the conductive particles in a dispersed state and having a smaller thickness than the particle diameter of the conductive particles,
   the granular structure layer being provided in any of a region existing between the free layer and the non-magnetic layer and a region existing between the non-magnetic layer and the pinned layer.

2. The magnetoresistive element as claimed in claim 1, wherein
   the granular structure layer is interposed between the pinned layer and the pinning layer, and
   the conductive particles are made of a magnetic metal material.

3. The magnetoresistive element as claimed in claim 1, wherein the magnetoresistive effect film further includes a film selected from the group consisting of a forward-direction stacked (top-type) spin valve film, a backward-direction stacked (bottom-type) spin valve film, a dual-type spin valve film, a ferri-pin-type spin valve film, a ferri-pin dual-type spin valve film, and a tunnel junction film, the film being inserted in the magnetoresistive effect film.

4. A magnetoresistive element that detects a change of magnetoresistance by giving a sense current in the thickness direction of a magnetoresistive effect film including at least a base layer, a free layer, a non-magnetic layer, a pinned layer, a pinning layer, and a protection layer,
   the magnetoresistive element comprising a granular structure layer that includes conductive particles and an insulating matrix material in the form of a thin film containing the conductive particles in a dispersed state and having a smaller thickness than the particle diameter of the conductive particles,
   the granular structure layer being interposed between divided layers that are formed by dividing at least one of the free layer, the non-magnetic layer, the pinned layer, and the pinning layer.

5. The magnetoresistive element as claimed in claim 4, wherein
   the granular structure layer is inserted in at least one of the free layer, the pinned layer, and the pinning layer, and
   the conductive particles are made of a magnetic metal material.

6. The magnetoresistive element as claimed in claim 4, wherein
   the granular structure layer is inserted in the non-magnetic layer, and
   the conductive particles are made of a non-magnetic metal material.

7. A magnetoresistive element that detects a change of magnetoresistance by giving a sense current in the thickness direction of a magnetoresistive effect film including at least a base layer, a free layer, a non-magnetic layer, a pinned layer, and a protection layer,
   the magnetoresistive element comprising a granular structure layer that includes conductive particles and an insulating matrix material in the form of a thin film containing the conductive particles in a dispersed state and having a smaller thickness than the particle diameter of the conductive particles,
   the granular structure layer being at least one of the free layer, the non-magnetic layer, and the pinned layer.

8. The magnetoresistive element as claimed in claim 7, wherein
   the granular structure layer constitutes the free layer, and the pinned layer, and
   the conductive particles in the granular structure layer are made of a magnetic metal material.

9. The magnetoresistive element as claimed in claim 7, wherein
   the granular structure layer constitutes the non-magnetic layer, and
   the conductive particles in the granular structure layer are made of a non-magnetic metal material.

10. A magnetic recording device, comprising a magnetoresistive element as a magnetic head for magnetic reproduction,
    the magnetoresistive element that detects a change of magnetoresistance by giving a sense current in the thickness direction of a magnetoresistive effect film including at least a base layer, a free layer, a non-magnetic layer, a pinned layer, a pinning layer, and a protection layer,
    the magnetoresistive element comprising a granular structure layer that includes conductive particles and an insulating matrix material in the form of a thin film containing the conductive particles in a dispersed state and having a smaller thickness than the particle diameter of the conductive particles,
    the granular structure layer being provided in any of a region existing between the free layer and the non-magnetic layer and a region existing between the non-magnetic layer and the pinned layer.

* * * * *